(12) United States Patent
Shindo et al.

(10) Patent No.: US 12,288,962 B2
(45) Date of Patent: Apr. 29, 2025

(54) OPTICAL TRANSMITTER

(71) Applicant: Nippon Telegraph and Telephone Corporation, Tokyo (JP)

(72) Inventors: Takahiko Shindo, Musashino (JP); Meishin Chin, Musashino (JP); Shigeru Kanazawa, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 558 days.

(21) Appl. No.: 17/760,662

(22) PCT Filed: Sep. 26, 2019

(86) PCT No.: PCT/JP2019/037956
§ 371 (c)(1),
(2) Date: Mar. 15, 2022

(87) PCT Pub. No.: WO2021/059447
PCT Pub. Date: Apr. 1, 2021

(65) Prior Publication Data
US 2022/0337026 A1    Oct. 20, 2022

(51) Int. Cl.
*H01S 5/00* (2006.01)
*H01S 5/026* (2006.01)
(Continued)

(52) U.S. Cl.
CPC .......... *H01S 5/026* (2013.01); *H01S 5/0265* (2013.01); *H01S 5/12* (2013.01); *H01S 5/34* (2013.01);
(Continued)

(58) Field of Classification Search
CPC .......... H01S 5/026; H01S 5/0265; H01S 5/12; H01S 5/34; H01S 5/50; H01S 5/5027; H01S 5/06226; H01S 5/1014; H01S 5/1039
See application file for complete search history.

(56) References Cited

U.S. PATENT DOCUMENTS

| 2010/0202776 A1* | 8/2010 | Kakitsuka ............ H04B 10/541 398/79 |
| 2021/0234332 A1* | 7/2021 | Shindo .................... H01S 5/026 |

(Continued)

FOREIGN PATENT DOCUMENTS

| JP | 2011-165823 A | 8/2011 |
| JP | 2017-098342 A | 6/2017 |
| JP | 2018-074098 A | 5/2018 |

OTHER PUBLICATIONS

W. Kobayashi, et al., *Novel Approach for Chirp and Output Power Compensation Applied to a 40-Gbit/s EADFB Laser Integrated with a Short SOA*, Apr. 2015, Opt. Express, vol. 23, No. 7, pp. 9533-9542.

*Primary Examiner* — Kinam Park
(74) *Attorney, Agent, or Firm* — Workman Nydegger

(57) ABSTRACT

In an EADFB laser with an integrated SOA, a new configuration in which deterioration of optical waveform quality is solved or mitigated while taking advantage of characteristics that the same layer structure can be used and the manufacturing process can be simplified is shown. In an optical transmitter of the present disclosure, a carrier density is optimized depending on a light intensity inside the SOA and an amount of carrier consumption. The SOA is electrically separated into a plurality of regions, and a current is injected into each region independently. The divided SOA region is configured so that a length of the SOA region becomes shorter as a region is farther from an incidence end of the (Continued)

SOA. Further, for the divided SOA, an amount of carrier consumption increases as the SOA region is farther from the incidence end, so that a current injection amount is increased.

7 Claims, 10 Drawing Sheets

(51) Int. Cl.
| | | |
|---|---|---|
| *H01S 5/12* | (2021.01) | |
| *H01S 5/34* | (2006.01) | |
| *H01S 5/50* | (2006.01) | |
| G02F 1/017 | (2006.01) | |
| H01S 5/062 | (2006.01) | |
| H01S 5/10 | (2021.01) | |
| H04B 10/50 | (2013.01) | |

(52) U.S. Cl.
CPC ............. *H01S 5/50* (2013.01); *H01S 5/5027* (2013.01); *G02F 1/01708* (2013.01); *G02F 2203/70* (2013.01); *H01S 5/06226* (2013.01); *H01S 5/1014* (2013.01); *H01S 5/1039* (2013.01); *H04B 10/503* (2013.01)

(56) References Cited

U.S. PATENT DOCUMENTS

| | | | |
|---|---|---|---|
| 2022/0043149 A1* | 2/2022 | LaChapelle | G01S 7/4865 |
| 2022/0236417 A1* | 7/2022 | LaChapelle | G01S 7/4815 |
| 2022/0291349 A1* | 9/2022 | LaChapelle | G01S 17/10 |

\* cited by examiner (a)

(b)

OPTICAL TRANSMITTER

TECHNICAL FIELD

The present invention relates to a semiconductor laser element. Examples of the semiconductor laser element include an optical transmitter including a modulator, a semiconductor optical amplifier, and a laser.

BACKGROUND ART

Hereinafter, a semiconductor laser element in which an electro-absorption (EA) optical modulator is integrated on a substrate is disclosed. Further, an optical transmitter including a distributed feedback (DFB) laser, an EA modulator, and a semiconductor optical amplifier (SOA) is also disclosed.

With the spread of video distribution services and the increase in mobile traffic demand in recent years, network traffic has increased explosively. In optical transmission lines responsible for networks, trends are to increase a transmission rate, reduce power consumption of optical transmission devices, and reduce a cost of the networks through extension of a transmission distance. Semiconductor modulation light sources used in optical transmission devices are also required to have high speed and high output while curbing an increase in power consumption.

FIG. 1 is a diagram illustrating a schematic configuration of an EA modulator integrated DFB (EADFB) laser. The EADFB laser has a higher extinction property and a better chirp property than a directly modulated laser and has been used in a wide range of applications. As illustrated in FIG. 1 illustrating a cross section (Y-Z plane) of a substrate passing through an optical waveguide, the EADFB laser 10 has a structure in which a DFB laser 1 and an EA modulator 2 have been integrated on the same substrate. The DFB laser 1 includes an active layer 4 composed of a multi quantum well (MQW) and oscillates at a single wavelength determined by a driving current source 8 and a diffraction grating 5 formed in a cavity. Further, the EA modulator 2 includes a light absorption layer 6 including an MQW having a composition different from that of the DFB laser 1 and changes an amount of light absorption through control of an electrical signal source 9. Through driving under a condition that output light from the DFB laser 1 is transmitted or absorbed, the light is blinked and an electrical signal is converted into an optical signal.

Because the EADFB laser is accompanied by a large optical loss in the EA modulator 6, it is difficult to achieve a high output. As a solution to this, an EADFB laser in which a semiconductor optical amplifier (SOA) has been further integrated with a light emission end of the EADFB laser (SOA assisted extended reach EADFB laser: AXEL) has been proposed (NPL 1). Hereinafter, for the sake of simplicity, a laser in which the SOA is further integrated with the EADFB laser is referred to as an AXEL.

FIG. 2 is a diagram illustrating a schematic configuration of an AXEL in which an SOA is integrated. In the AXEL 20 of FIG. 2, which illustrates a cross section (a Y-Z plane) of a substrate passing through an optical waveguide, as in FIG. 1, signal light modulated by an EA modulator 2 is amplified by an integrated SOA region 3, thereby improving optical output. In the configuration of the AXEL 20, a high output of about twice that of a general EADFB laser can be obtained. Further, when the AXEL 20 is driven under an operating condition in which the same optical output as that of the general EADFB laser can be obtained, power consumption can be reduced by about 40% because of a high efficiency operation due to an SOA integration effect. In the AXEL 20, the same MQW structure as the active layer 4 of the DFB laser 1 is used as an active layer 7 of an SOA 3. In the AXEL 20, a device can be made through the same process as in an EADFB laser of the related art without a need to add a regrowth process for integration of the SOA region.

CITATION LIST

Non Patent Literature

NPL 1: W. Kobayashi, et al., "Novel approach for chirp and output power compensation applied to a 40-Gbit/s EADFB laser integrated with a short SOA", April 2015, Opt. Express, Vol. 23, No. 7, pp. 9533-9542

SUMMARY OF THE INVENTION

Technical Problem

However, in an AXEL in which an SOA is monolithically integrated, the same manufacturing process as in an EADFB laser can be used, but there is a problem that a degree of freedom in designing a structure of the SOA is limited and optical waveform quality deteriorates as will be described below.

Means for Solving the Problem

One aspect of the present disclosure is an optical transmitter including, on a substrate, a distributed feedback (DFB) laser including an active region with a multi quantum well, an electro-absorption (EA) modulator configured to modulate light emitted from the DFB laser, and a semiconductor optical amplifier (SOA) having an active region with an identical composition as the active region of the DFB laser and configured to amplify signal light from the EA modulator, in which the SOA includes two or more electrically separated regions along an optical waveguide direction, and an N-th region (N is equal to or greater than 2) counting from an incidence end of the SOA is shorter than the region present in a portion adjacent to the N-th region and proximate to the incidence end.

Effects of the Invention

The optical transmitter of the present disclosure solves and mitigates a problem of deterioration of optical waveform quality.

DESCRIPTION OF EMBODIMENTS

In the present disclosure, in an EADFB laser in which an SOA has been integrated (hereinafter also referred to as an AXEL), a new configuration in which a problem of deterioration of optical waveform quality is solved or mitigated while keeping a characteristic that a manufacturing process can be simplified by using the same layer structure for a DFB laser and an SOA is indicated. The EADFB laser in which the SOA has been integrated can be used as an optical transmitter. Further, the present disclosure includes an aspect as an optical transmission device including an optical transmitter. Hereinafter, a characteristic operation of the present disclosure as an optical transmitter will be described, but this can also be used in various forms of devices that transmit signal light carrying information. Further, hereinafter, an AXEL and an optical transmitter are substantially synonymous and will be described interchangeably.

Figure 1:
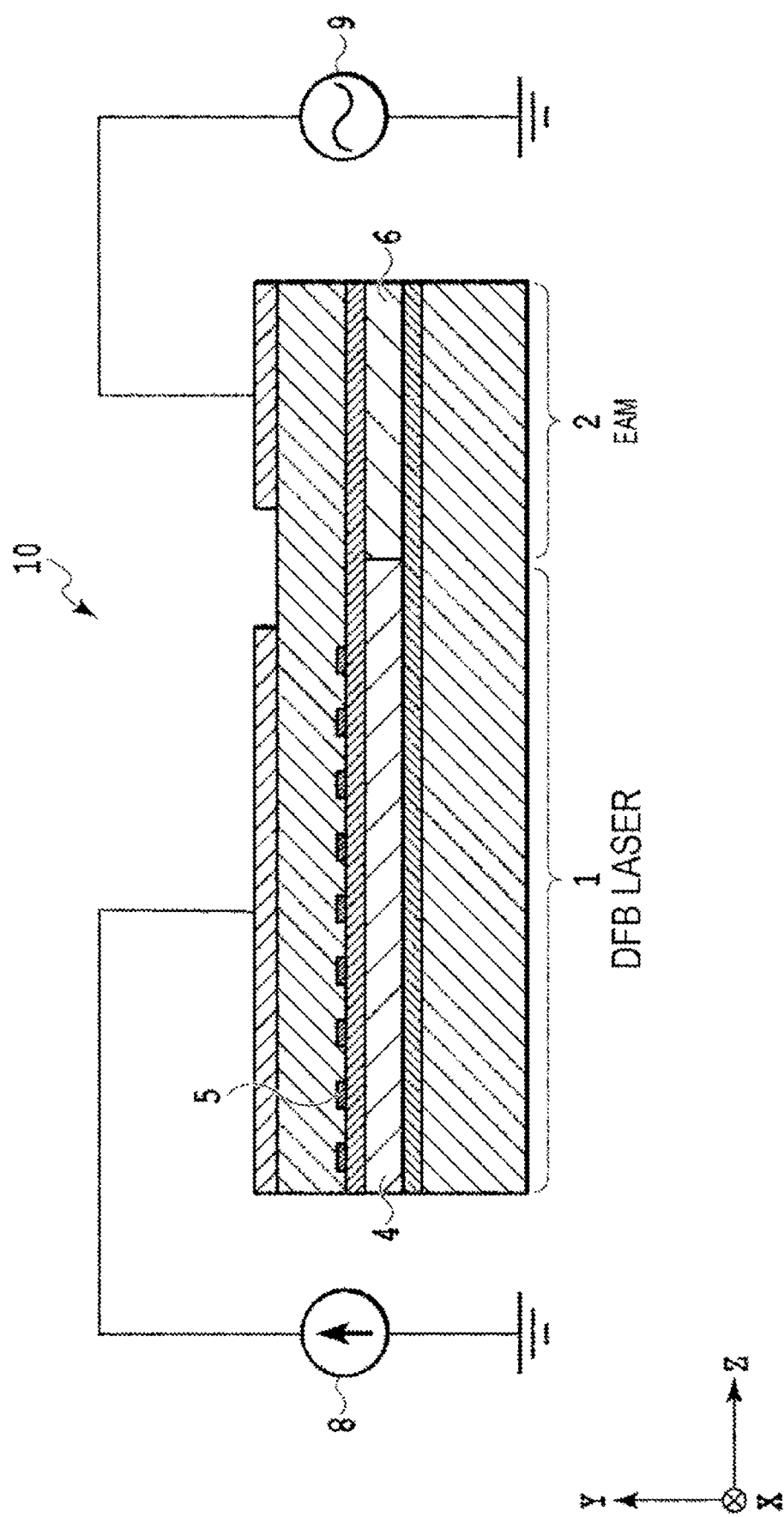
FIG. 1 is a diagram illustrating a schematic configuration of an EA modulator integrated DFB laser.
Figure 2:
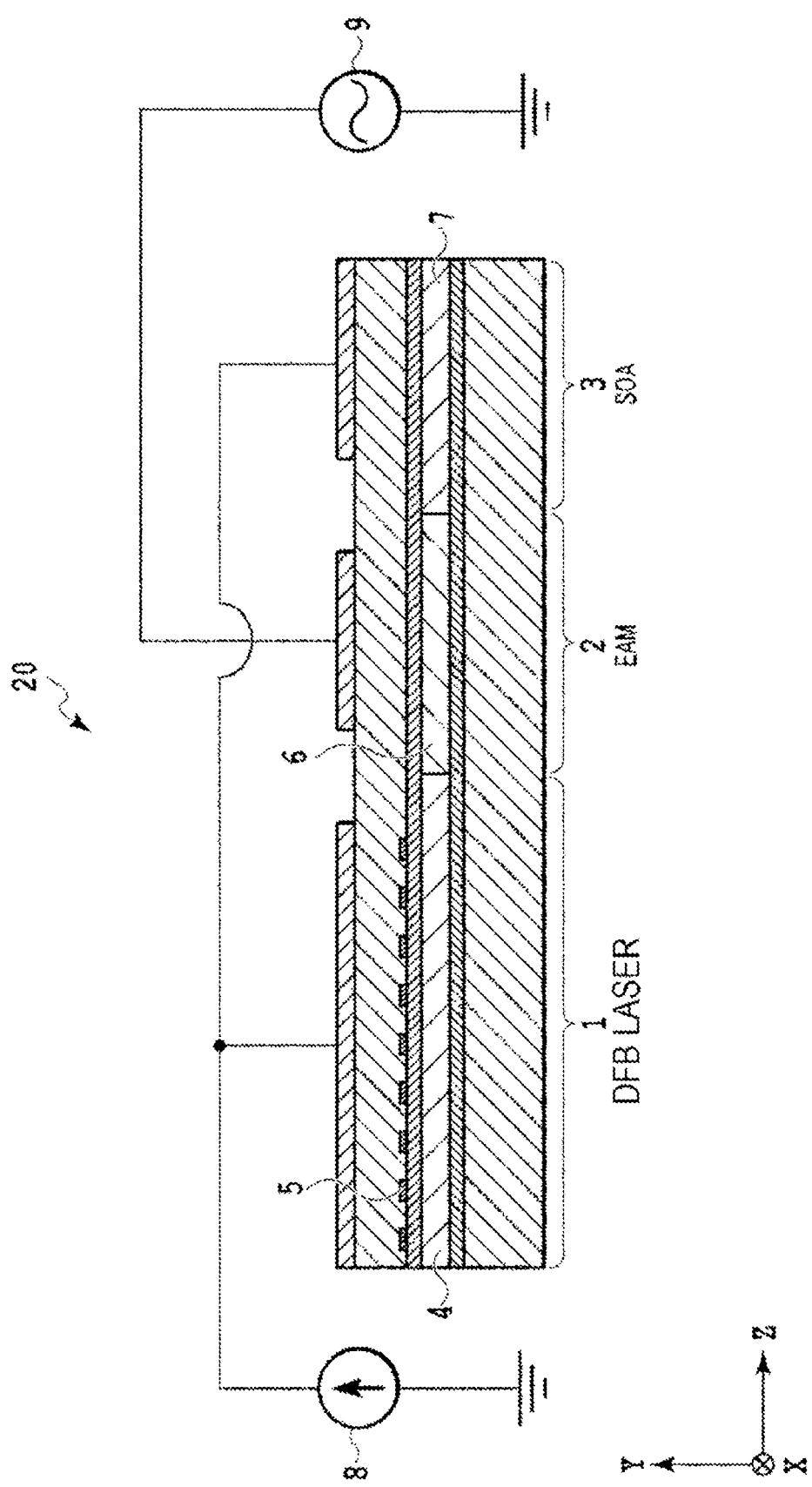
FIG. 2 is a diagram illustrating a schematic configuration of an AXEL in which an SOA is further integrated.

As a problem due to constraints of a layer structure of the SOA of the AXEL, there is the deterioration of optical signal waveform quality in the SOA due to the pattern effect. The pattern effect is known as a phenomenon in which distortion of a waveform changes depending on a configuration of a pulse train to be transmitted. As illustrated in FIG. 2, in the AXEL 20, the output light from the DFB laser 1 is modulated by the EA modulator 2, and then incident on and amplified by the SOA 3. The incident light on the SOA 3 is modulated and is signal light of which intensity changes with time. Inside the SOA 3, a carrier generated by current injection is consumed by optical amplification. When the signal light is incident on the SOA 3, the light intensity of the signal light constantly fluctuates, and thus an amount of carrier consumption in the SOA 3 also fluctuates with the light intensity. For example, when the light intensity of the incident signal light continues to be strong, carriers inside the SOA tend to be almost exhausted, and conversely, when the light intensity of the signal light continues to be weak, the internal carriers are not consumed and a carrier density increases. Thus, an optical gain of the SOA also fluctuates due to a random state change of the intensity of the signal light, which adversely affects the optical waveform quality. As will be described next, an influence of the pattern effect is strongly generated on the optical waveform, especially when the continuation of the same sign continues.

When light is subjected to intensity modulation (on-off-keying (OOK)) using a non-return-to-zero (NRZ) signal scheme, a state in which light intensity is strong is called a "1" level, a state in which the light intensity is weak is called a "0" level, and a behavior of the SOA when the same sign continues is considered. When bits at a "0" level continue, the light intensity of the signal light incident on the SOA continues to be weak and the amount of carrier consumption inside the SOA continues to be low, such that the carrier density is kept high. When the signal light changes to a "1" level after the signal light at a "0" level continues, the situation changes and the carriers accumulated in the SOA are consumed at once. In this case, it is easy for the optical signal waveform to greatly overshoot.

On the other hand, when signal light in which bits at a "1" level continue is incident on the SOA, the light intensity of the signal light is always kept strong, many carriers are consumed for optical amplification, and the optical gain of the SOA decreases. As a result, the "1" level of the optical signal waveform decreases and the quality of the optical signal waveform deteriorates. Such a pattern effect in the SOA is particularly remarkable when the carrier density in the SOA decreases. For the same reason, a strong influence of the pattern effect appears even when an SOA length is long. Further, because a substantial time when the same sign continues becomes long when a bit rate of a modulation signal is low, it is particularly easy for an influence of the pattern effect to appear.

Figure 3:
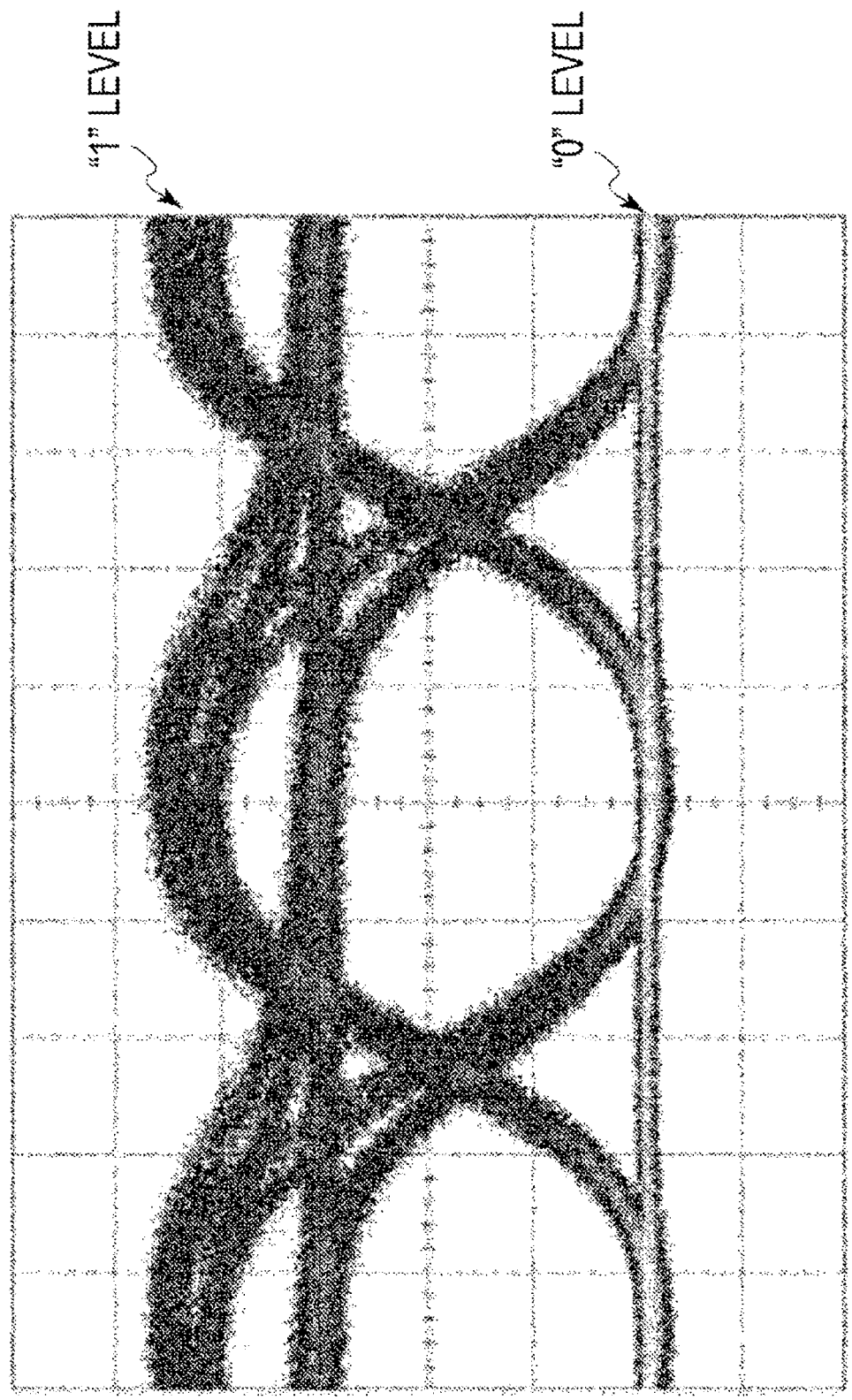
FIG. 3 is a diagram illustrating an NRZ optical waveform when a pattern effect occurs in the SOA.

FIG. 3 is a diagram illustrating an NRZ optical waveform when the pattern effect occurs in the SOA. In the AXEL 20 illustrated in FIG. 2, a 10 Gbit/s NRZ optical waveform (eye pattern) when the pattern effect occurs is illustrated. As described above, at a "0" level at which the carrier density is kept high, an optical waveform is stable at a substantially uniform level. On the other hand, it can be seen that, at a "1" level at which carriers are consumed, the carrier density inside the SOA changes and becomes unstable according to a state of an input signal, and a level of the optical waveform also varies. Deterioration of optical waveform quality as illustrated in FIG. 3 leads to deterioration of transmission quality, which causes an inability to transmit an optical signal over a sufficient distance. In order to curb the pattern effect, it is necessary to increase the carrier density inside the SOA. However, as described above, the SOA 3 of the AXEL 20 is limited to an active layer (MQW) having the same layer structure as the DFB laser 1. It is difficult to adjust the carrier density inside the SOA, and the curbing of the pattern effect is limited. In an AXEL of the related art, an optical confinement factor and a current density of a DFB laser and an SOA cannot be set separately due to a limitation of a layer structure of the SOA.

In particular, when the SOA region is long, the influence of the pattern effect becomes large, and even when a sufficient SOA current is injected, the deterioration of the optical waveform quality cannot be sufficiently curbed. Specifically, when an NRZ signal having a bit rate of about 10 Gbit/s is input to the SOA and an SOA length becomes 200 μm or more, the pattern effect cannot be sufficiently curbed even when an SOA current amount is increased.

In the AXEL of the present disclosure, the SOA is electrically separated into a plurality of regions along an optical waveguide direction, and a current is injected into the respective regions independently while using the same layer structure for the DFB laser and the SOA. The divided SOA region is configured to be shorter as the region is farther from the incidence end. Further, for the divided SOA region, a current injection amount (current density) is increased as a region is farther from the incidence end. With the structure of the SOA electrically separated into a plurality of regions, a problem of waveform deterioration due to the pattern effect in the related art is solved and mitigated. The waveguide structure of the DFB laser and the SOA is manufactured using a batch process. Thus, in the AXEL of the present disclosure, no change is required for a manufacturing process of the AXEL of the related art, and a characteristic configuration of the SOA can be achieved simply by modifying a mask pattern at the time of forming a waveguide of the SOA.

The curbing of the pattern effect in the optical transmitter of the present disclosure will be described below. As described above, it is preferable to increase the carrier density in the waveguide as a method of curbing the pattern effect generated in the SOA. However, simply increasing the carrier density of the entire SOA is not sufficient to curb the pattern effect. The inventors have focused on the change in carrier density in the optical waveguide direction in the SOA region, and have found a mechanism for more effectively curbing the pattern effect.

Consumption of carriers due to optical amplification inside the SOA is not uniform, and the amount of carrier consumption is larger in a region in which a light intensity and a light power inside the SOA are strong. Here, when light propagates inside an SOA including an active layer having an optical gain g, light power P after the light propagates over a length L is expressed by the following equation.

$$P = P_0 \exp\{(\Gamma g - \alpha)L\} \qquad \text{Equation (1)}$$

In Equation (1), $P_0$ is the light power at the time of incidence on the SOA, $\Gamma$ is an optical confinement factor in the active layer having an optical gain, and a is a loss at the time of propagation. That is, when $(\Gamma g - \alpha) > 0$ is satisfied, the SOA has an amplification effect, and a net optical gain $(\Gamma g - \alpha)$ acts according to a propagation length L to amplify the light.

Figure 4:
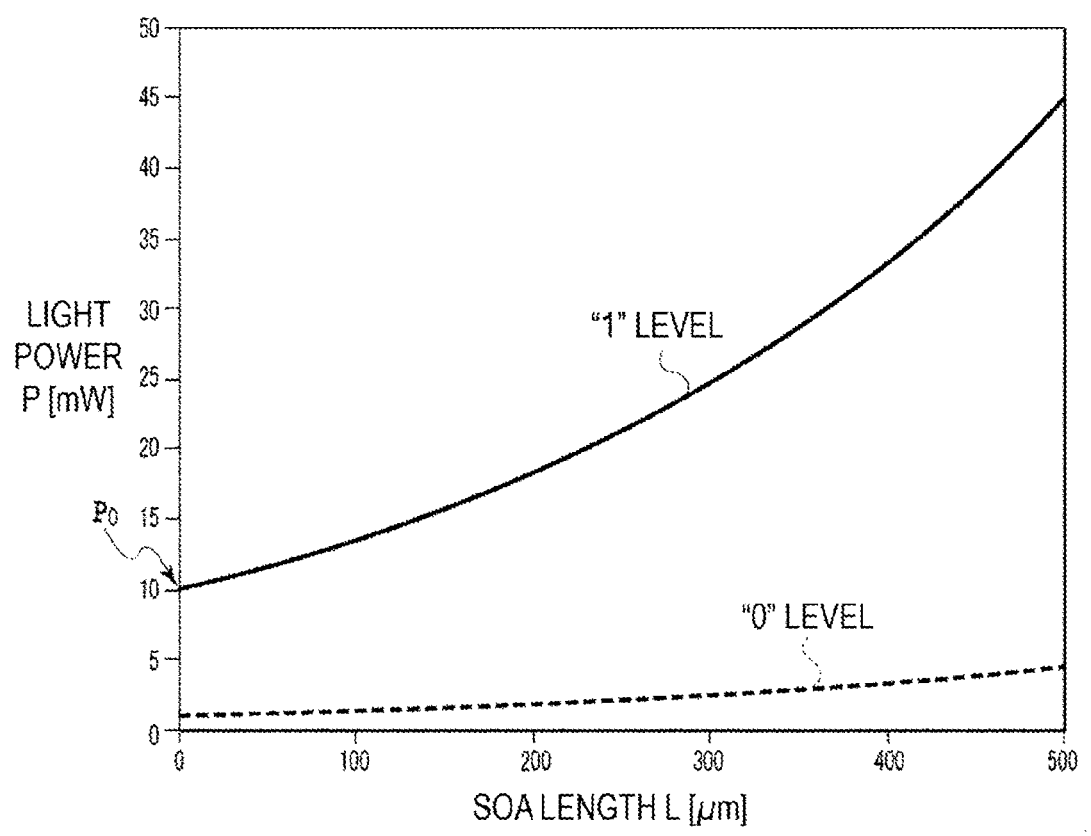
FIG. 4 is a diagram illustrating an example of calculation of a change in light power in an optical waveguide direction inside the SOA.

FIG. 4 is a diagram illustrating an example of calculation of a light power change in the optical waveguide direction inside the SOA. A horizontal axis in FIG. 4 indicates an SOA length L from a starting point of the SOA region proximate to the EA modulator, that is, a propagation distance (μm) of the light, and a vertical axis indicates the light power P (mW). Thus, FIG. 4 illustrates a state in which light propagating inside the SOA is amplified according to an optical gain shown in Equation (1), and the light power gradually increases. Here, a "1" level and a "0" level are assumed as incident light power $P_0$ and are calculated in the case of 10 mW and 1 mW, respectively. It can be seen that the light power increases with the SOA length L, which is a propagation distance inside the SOA, and the longer the propagation distance, the more the light power literally increases exponentially.

As illustrated in FIG. 4, in the SOA, the light power is low near the light incidence end and is stronger in a portion (L is large) farther toward the emission end from the incidence end. Thus, the amount of carrier consumption per unit length of the SOA also increases exponentially from the incidence end to the emission end, like the light power. In particular, a change in light intensity due to optical amplification is steep in a region far from the incidence end of the SOA. Based on this point, even when an injection current to the SOA is simply increased, it is difficult to achieve an optimum carrier density over the entire inside of the SOA because the amount of carrier consumption spatially differs inside the SOA. It has been difficult to effectively curb the deterioration of the pattern effect and the optical waveform quality by simply increasing the SOA current.

In the optical transmitter of the present disclosure, the SOA is electrically separated into a plurality of regions, and a current is injected into each region independently in order to optimize the carrier density depending on the light intensity inside the SOA and the amount of carrier consumption. The divided SOA region is configured so that a length of the SOA region becomes shorter as a region is farther from the incidence end of the SOA. Further, for the divided SOA, the amount of carrier consumption increases as the region is farther from the incidence end, so that a current injection amount (current density) is increased.

The SOA is divided and a current is supplied to each region independently, so that carriers are injected concentratively in a region in which the light intensity is high and the amount of carrier consumption is large, and unnecessary carrier injection into a region in which the light intensity is low and the amount of carrier consumption is small is curbed. Accordingly, carrier depletion or excessive carrier accumulation is avoided in each divided SOA region, and spatial fluctuations in carrier density are curbed even when an optical signal has been incident. Non-uniformity of the carrier density in the SOA is mitigated so that the deterioration of the optical waveform quality due to the pattern effect can be curbed and transmission quality can be improved. Further, because efficient injection of carriers into each divided region of the SOA is possible, optical waveform quality is improved without an excessive SOA current unlike the related art, and both a low power consumption operation and high optical waveform quality can be achieved.

Hereinafter, a configuration of the SOA will be described in description of "dividing" of the SOA region or the like, but in the optical transmitters of Examples 1 and 2, a waveguide structure of the SOA is not physically divided and does not have a different composition. Thus, different "divided" SOA regions actually have an integral continuous waveguide structure. "To divide" means that separate electrodes can be formed to supply an SOA current and function independently, and the regions are electrically separated. On the other hand, in the optical transmitter of Example 3, it should be noted that, in at least a part between the different SOA regions, a waveguide structure is actually separated by a passive waveguide, in addition to the electrical separation by the separate electrodes.

Hereinafter, specific examples of the optical transmitter according to the AXEL of the present disclosure will be further described.

Example 1

Figure 5:
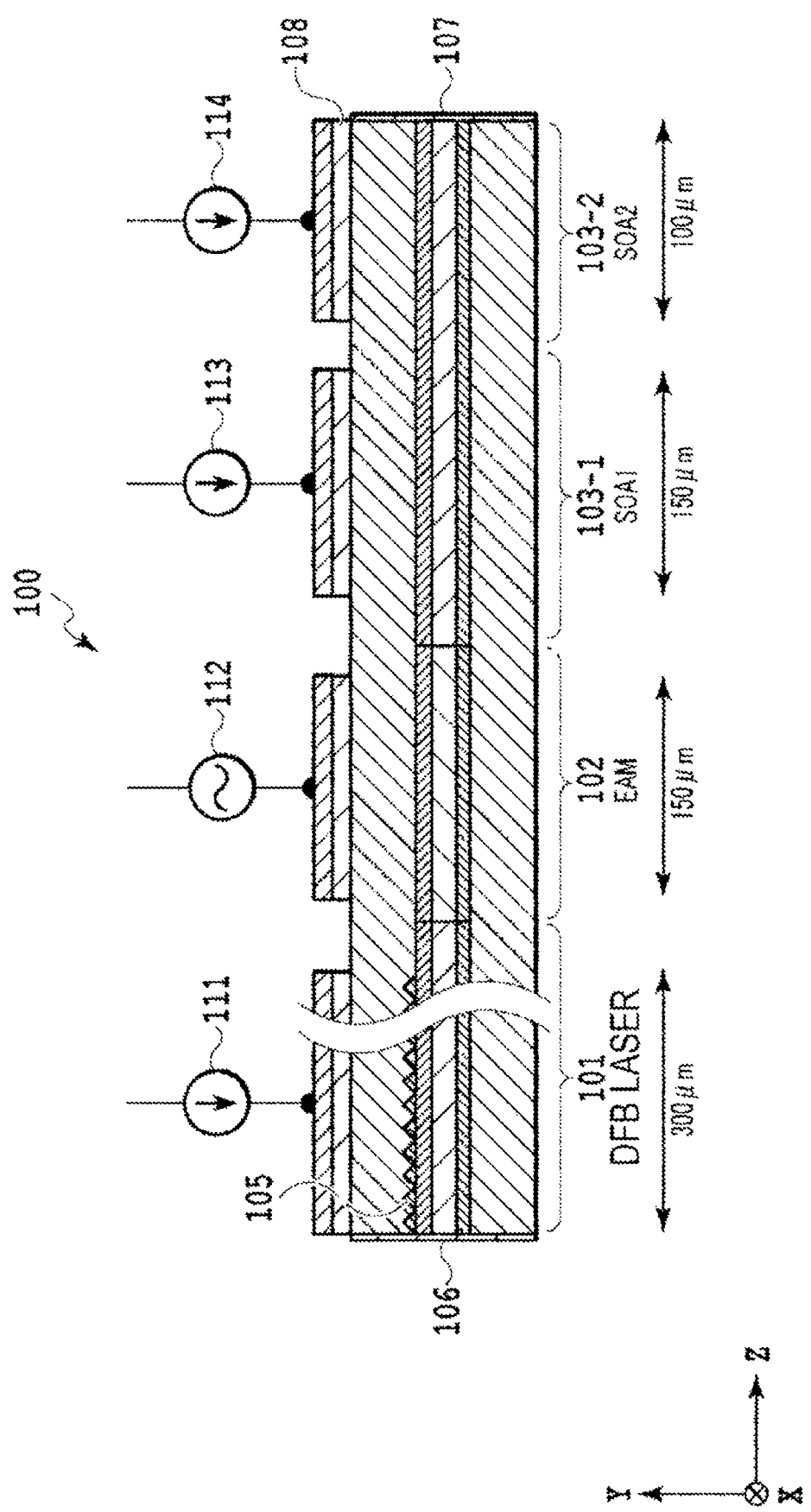
FIG. 5 is a diagram illustrating a configuration of an optical transmitter of Example 1 according to the AXEL of the present disclosure.

FIG. 5 is a diagram illustrating a schematic configuration of the optical transmitter of Example 1 according to the AXEL of the present disclosure. In the optical transmitter 100, a DFB laser 101, an EA modulator 102, and SOAs 103-1 and 103-2 are integrated in that order on a substrate, and FIG. 5 is a diagram illustrating an internal cross section passing through the center of the optical waveguide from a side surface (y-z plane) of the substrate. The optical transmitter 100 includes the DFB laser 101 having a length of 300 μm, the EA modulator 102 having a length of 150 μm in front of the laser 101, a first SOA region 103-1 (SOA 1) having a length of 150 μm, and a second SOA region 103-2 (SOA 2) having a length of 100 μm. As described above, when a modulation signal of about 10 Gbit/s is amplified by the SOA, it is difficult to sufficiently curb the influence of the pattern effect even when the amount of current is increased in a case in which the SOA length is 200 μm or more. In the optical transmitter of the present example, when a length of the first SOA region (SOA 1) is set to 200 μm or more, an influence of the pattern effect is present at a stage in which the signal light passes through the SOA 1. Thus, in the present example, the SOA region is divided into two regions (SOA 1 and SOA 2), and a region with a length of 150 μm is used as the SOA 1 region. As described above, the influence of the pattern effect also changes depending on a bit rate of the modulation signal. Thus, in the case of an optical transmitter operating at a high speed of 10 Gbt/s or more in which the influence of the pattern effect is weakened, the first SOA region (SOA 1) can be further lengthened.

Thus, the optical transmitter of the present disclosure includes, on a substrate, a distributed feedback (DFB) laser 101 including an active region with a multi quantum well, an electro-absorption (EA) modulator 102 configured to modulate oscillation light of the DFB laser, and a semiconductor optical amplifier (SOA) having an active region with the same composition as the active region of the DFB laser and configured to amplify signal light from the EA modulator, in which the SOA includes two or more electrically separated regions 103-1 and 103-2 along an optical waveguide direction, and an N-th region (N is equal to or greater than 2) 103-2 counting from an incidence end of the SOA is shorter than the region 103-1 present in a portion adjacent to the N-th region and proximate to the incidence end.

Here, a process of manufacturing the integrated circuit (AXEL) of the optical transmitter 100 will be described. For element manufacture, an initial substrate in which a lower separate confinement heterostructure (SCH) layer, an active layer (MQW1) of a multi quantum well layer, and an upper SCH layer were sequentially grown on an n-InP substrate was used. Here, the multi quantum well includes six quantum well layers and has an optical gain in an oscillation wavelength of 1.55 μm. The initial substrate including each of the above-described layers has a structure optimized for high-efficiency operation of the DFB laser 101. The initial substrate is used because the initial substrate is widely available, and the above-described layers may be manufactured without using the initial substrate. It should be noted that a scale in a substrate thickness direction (Y-axis) in FIG. 5 differs from an actual size, and the vicinity of the active layer is significantly enlarged for easy viewing.

In the present example, a length of each region is a length of the corresponding electrode. In each of the examples, a contact layer is formed directly under the electrode, and a region with the electrode substantially functions as each layer. In each figure, it should be noted that a gap between the regions is drawn to be wider than a real gap so that each region can be easily identified, and a thickness direction (y-axis) is enlarged rather than an electrode length (z-axis).

As an integrated circuit manufacture process, first, the DFB laser 101 and a portion serving as the SOA region were left, the other active layer was selectively etched, and a multi quantum well layer (MQW2) for the EA modulator 102 was grown through butt joint regrowth. Subsequently, a diffraction grating 105 operating in an oscillation wavelength band of 1.55 μm was formed in a region of the DFB laser.

Thereafter, a p-InP cladding layer and a contact layer 108 were grown on an entire surface of an element by regrowth. A thickness of the cladding layer was 2.0 μm in the present example so that a field of the light is not hang over an electrode region. A mesa structure was formed by etching. In this process, any pattern of the waveguide in each region is formed through a photolithography process and the waveguide is formed through a batch etching process. Even when the SOA is designed to be divided into a plurality of regions as in the optical transmitter according to the AXEL of the present disclosure, the above-described manufacturing process is the same as that of the related art, and the optical transmitter can be manufactured without increasing a process load or cost.

Then, Fe-doped semi-insulating InP layers were formed on both sides of a mesa by embedding and regrowth. Subsequently, the contact layers between the respective regions were removed by wet etching in order to electrically separate the respective regions of the DFB laser, the EA modulator, and the SOA. Through this process, the two SOA regions are electrically separated because a large electric resistance value can be obtained between SOA 1 and SOA 2, and independent current driving can be performed. Then, a P-side electrode for injecting a current through an InGaAsP contact layer on each region of an upper surface of the InP substrate was formed. Thereafter, a back surface of the InP substrate was polished to about 150 μm, an electrode was formed on a back surface of the substrate, and the process on a semiconductor wafer was completed.

In each element on the wafer, anti-reflective coating (AR) 107 is performed on a front end face adjacent to the SOA 103-2 and highly reflective coating (HR) 106 is performed on a rear end face opposite to the front end face, after an end face from which light is emitted is cut out. In the optical transmitter 100 of the present example, a core layer structure formed in the initial substrate remains as it is in the SOAs 103-1 and 103-2, and is the same as a layer structure of the DFB laser 101. The only difference in layer structure between the DFB laser 101 and SOAs 103-1 and 103-2 is the presence or absence of a diffraction grating. In the optical transmitter 100 of the present example, a common layer structure is used for the DFB laser and the SOA, such that the number of regrowths is curbed in a structure in which a plurality of functional regions have been integrated, resulting in manufacture at low cost.

Referring back to FIG. 5, the waveguide of the optical transmitter 100 of the present example has a laminated structure including a core layer (a total layer thickness of 200 nm) formed of an active layer of a multi quantum well layer, upper and lower SCH layers, and InP cladding layers with the core layer vertically sandwiched therebetween, in a vertical direction of a cavity. In a horizontal direction, the waveguide has an embedded heterostructure in which InP layers are formed on both sides of the mesa, as illustrated in FIG. 9(a) to be described below. As a stripe width, 1.5 μm at which the laser operates most stably through the DFB laser region 101 and the EA modulator 102 was adopted. Further, in the SOA 1 and SOA 2, a core layer structure formed in the initial substrate remains as it is, and is the same as that of the DFB laser. The only difference in layer structure between the DFB laser and the SOA is the presence or absence of a diffraction grating 105. As a result, the number of times the regions are regrown is reduced even in the structure in which multiple regions are integrated, and low cost manufacturing can be achieved.

Modulation characteristics of 10 Gbit/s were evaluated using a manufactured element. Optical transmitters having a single undivided SOA region having a length of 250 μm were simultaneously manufactured on the same substrate, and evaluation was performed under the same conditions to verify effects of the configuration of the present example. As the modulation signal, a pseudo-random binary sequence PRBS2$^{31}$-1 was used. Here, a current 111 of the DFB laser was set to 80 mA, a voltage applied to the EA modulator was set to −1.5 V, currents 113 and 114 of SOA 1 and SOA 2 were set to 40 mA and 60 mA, respectively, and a total current of 100 mA flowed through the two SOA regions. Current values per unit length in the optical waveguide direction in the two SOA regions were 0.27 mA/μm and 0.6 mA/μm, respectively. Thus, the second SOA region 103-2 (SOA 2)

positioned in the posterior stage operated at a higher current density. An amplitude voltage Vpp of a signal 112 applied to the EA modulator was 1.5 V.

When an optical output at the time of modulation was evaluated by fiber coupling using a standard single-mode fiber with a lens, the modulated light output power of 9.5 dBm was obtained for the optical transmitter of the present example having a structure in which the SOA was divided into two regions. Similarly, for a device of the related art in which an SOA was not divided, a current injected to the laser, a voltage applied to the EA modulator, and an amplitude voltage were made the same as the above conditions, a current of 120 mA was applied to a single SOA, and the same measurement was performed. An modulated light output power of the optical transmitter according to the configuration of the related art in this case was 9.2 dBm. Thus, in the optical transmitter of the present example operating with a total SOA current of 100 mA, substantially the same optical output was obtained with a smaller SOA current as compared with the related art operating at 120 mA. This is because the carrier density (SOA current density) is adjusted according to the amount of carrier consumption depending on the light intensity inside the SOA so that decrease in carrier density is compensated for and a high gain is obtained even in a region near the emission end of the SOA, and a highly efficient operation is achieved in the entire SOA region.

Figure 6:
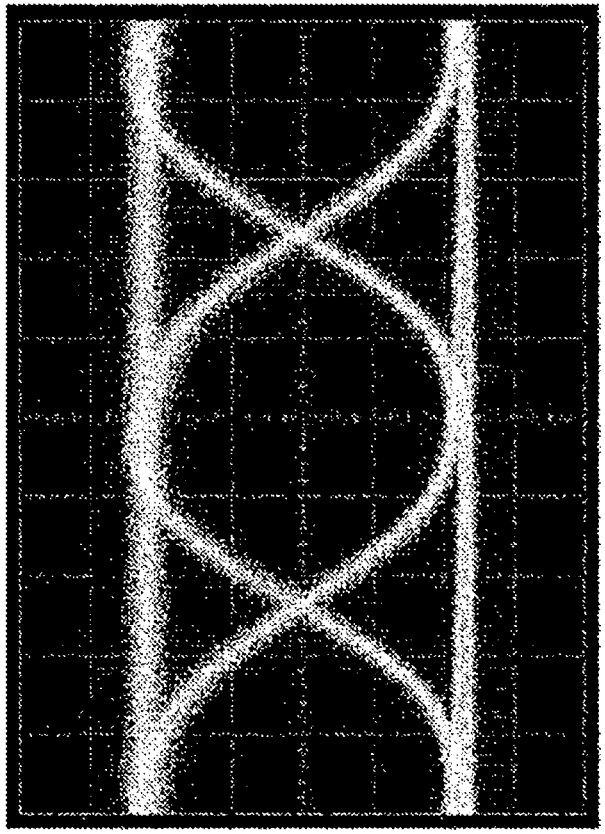
FIG. 6 is a diagram illustrating improvement of an eye pattern in the optical transmitter of Example 1.
Figure 6:
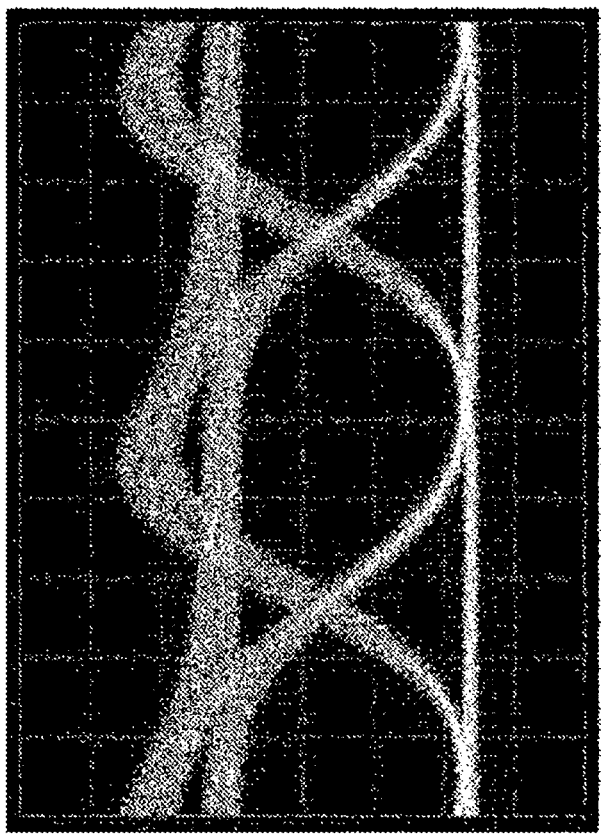

FIG. 6 is a diagram illustrating improvement of the eye pattern in the optical transmitter of Example 1. FIG. 6(a) illustrates an eye pattern of the optical transmitter 100 including the SOA divided into the two regions in the present example. FIG. 6(b) illustrates an eye pattern of an optical transmitter including a single SOA of the related art for comparison. Obviously, it can be seen that, with the optical transmitter of the present example, a clearer eye opening is obtained and eye pattern waveform quality is improved. When transmission characteristics were evaluated using a 40 km single-mode fiber under the same conditions, error-free transmission was confirmed in the optical transmitter of the present example in which the SOA was divided. On the other hand, an optical transmitter of the related art in which the SOA was not divided could not be error-free. From these results, it was confirmed that the signal transmission quality was also improved in the optical transmitter of the present example in which the SOA was divided.

As illustrated in FIGS. 5 and 6, the SOA is divided into two regions in the optical waveguide direction and the carrier density is adjusted depending on the amount of carrier consumption so that deterioration of optical signal waveform quality due to the pattern effect can be curbed and the quality of the optical waveform with a clear eye opening was confirmed.

In the above-described embodiment, an example in which the SOA is divided into two regions in the optical waveguide direction is shown. The number of divided regions can be increased to 3 or more so that the carrier density can be finely adjusted depending on the amount of carrier consumption. Next, an example in which the SOA is divided into three regions in the optical waveguide direction will be shown.

Example 2

Figure 7:
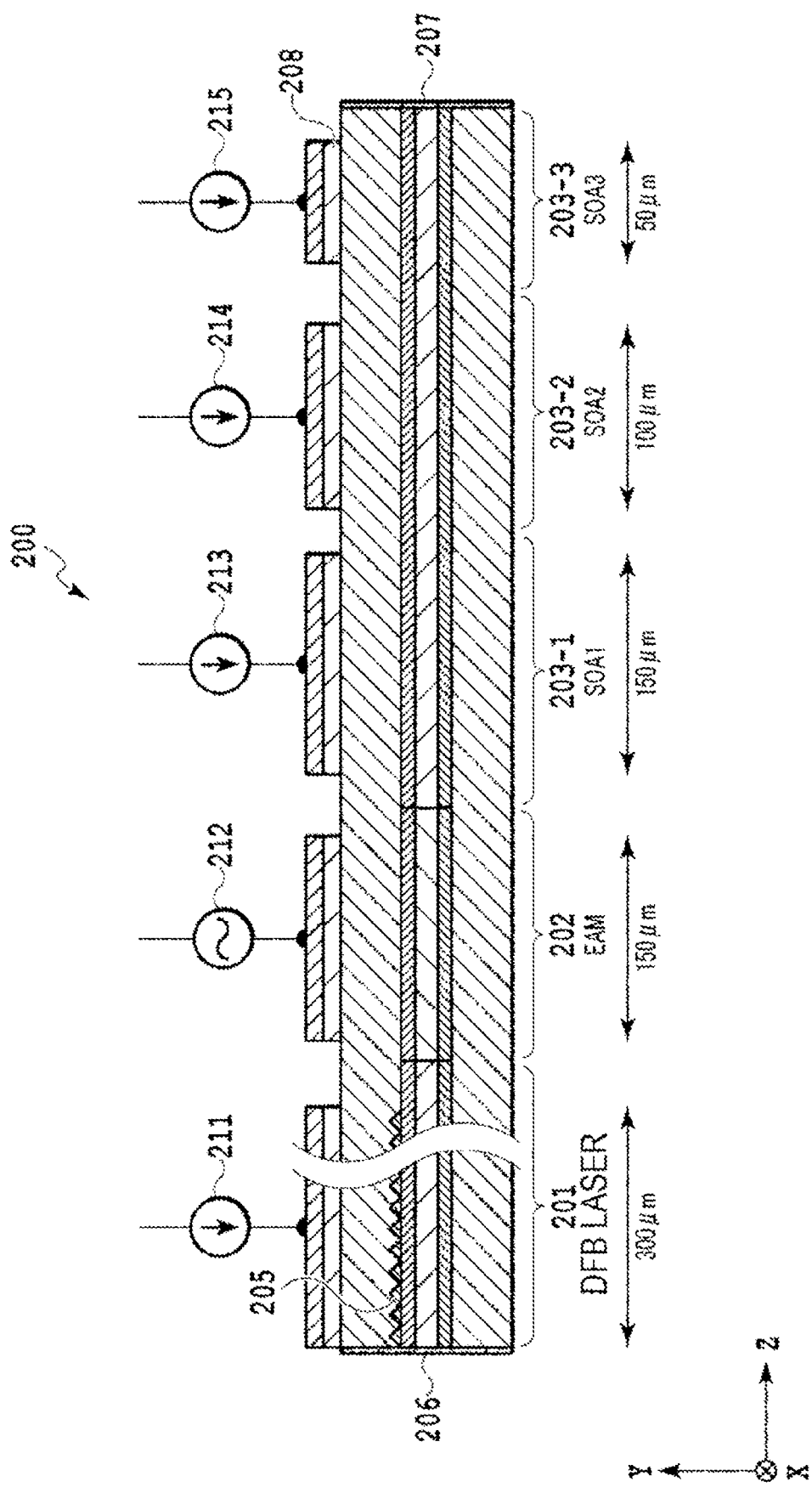
FIG. 7 is a diagram illustrating a configuration of an optical transmitter of Example 2 according to the AXEL of the present disclosure.

FIG. 7 is a diagram illustrating a configuration of the optical transmitter of Example 2 according to the AXEL of the present disclosure. In the optical transmitter 200, a DFB laser 201, an EA modulator 202, and SOAs 203-1 to 203-3 are integrated in this order on the substrate, and in FIG. 7, an internal cross section passing through the center of the optical waveguide is viewed from a side surface (y-z plane) of the substrate, as in Example 1 of FIG. 5. The optical transmitter 200 includes the DFB laser 201 having a length of 300 μm, the EA modulator 202 having a length of 150 μm in front of the DFB laser 201, and the first SOA region 203-1 (SOA 1), the second SOA region 203-2 (SOA 2) and the third SOA region 203-3 (SOA 3) having respective lengths of 150 μm, 100 μm, and 50 μm. A total length of the three SOA regions is 300 μm, which is larger than that of the SOA region of the optical transmitter of Example 1 (250 μm in total), aiming at a higher output.

A manufacturing process of the optical transmitter of the present example is the same as that of Example 1 described above, and only a mask pattern has been changed in which the number of divisions of the region in the SOA is increased from 2 to 3 so that the number of integrations is increased. The oscillation wavelength is a 1.55 μm band in which a single wavelength operation is performed due to a diffraction grating formed in the region of the DFB laser.

Modulation characteristics of 10 Gbit/s were evaluated using a manufactured element. As the modulation signal, a pseudo-random binary sequence PRBS$2^{31}$-1 was used. In the present example, a current 211 of the DFB laser was set to 80 mA, a voltage applied to the EA modulator was set to −1.5 V, and currents 213, 214, and 215 of the three SOA regions SOA 1, SOA 2, and SOA 3 were set to 50 mA, 40 mA, and 30 mA, respectively. A total current of 120 mA flowed in the three SOA regions. Current values per unit length in the optical waveguide direction in the three SOA regions were 0.33 mA/μm, 0.4 mA/μm, and 0.6 mA/μm, respectively, and the SOA region positioned at a more posterior stage operates at a higher current density. An amplitude voltage Vpp of a signal 212 applied to the EA modulator was 1.5 V. When the modulated light output power of the optical transmitter of Example 2 was evaluated by fiber coupling using a single-mode fiber with a lens, 12.3 dBm was obtained. A high output of about twice (+3 dB) was obtained unlike the optical output of 9.5 dBm of Example 1. In the optical transmitter of Example 3, a long SOA length having a total length of 300 μm is adopted so that extremely high optical output characteristics are achieved as compared with the optical output of the optical transmitter according to a configuration of the related art.

Figure 8:
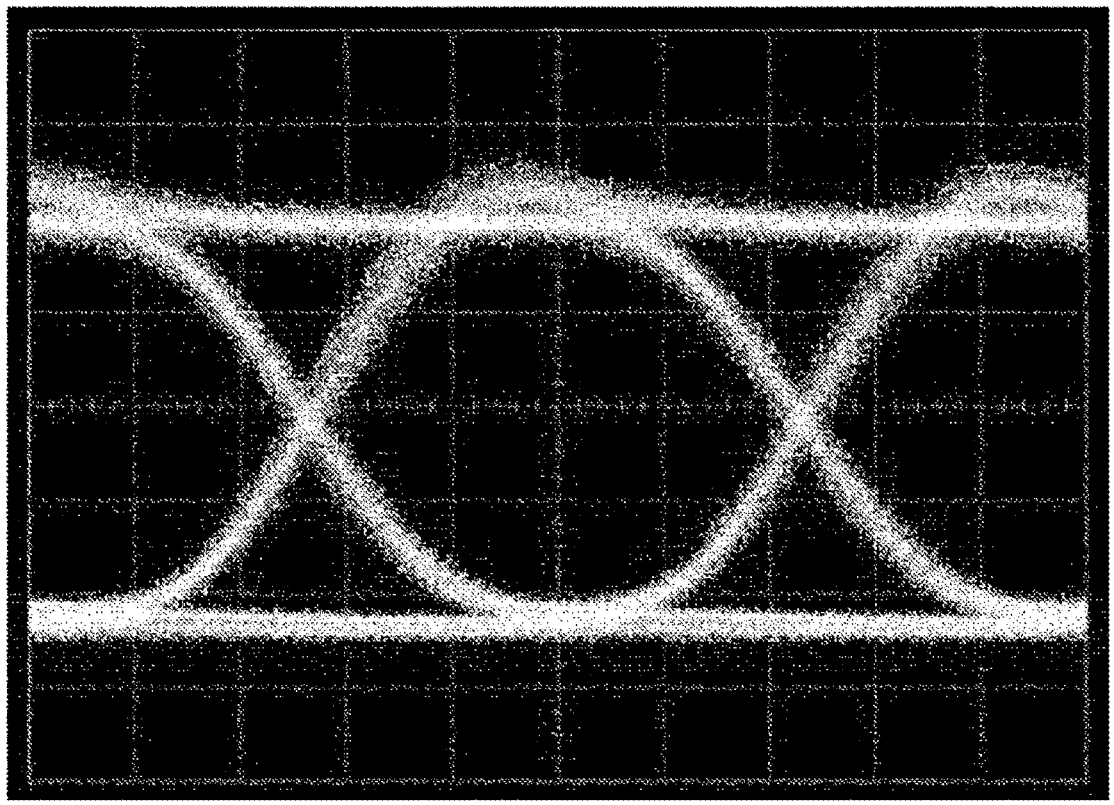
FIG. 8 is a diagram illustrating an eye pattern in the optical transmitter of Example 2.

FIG. 8 is a diagram illustrating an eye pattern in the optical transmitter of Example 2. An eye pattern waveform for 10 Gbit/s modulation is shown. Three divided SOA regions are included and the current density toward the emission end is increased as in the optical transmitter of the present example, so that a high-quality eye pattern waveform having a clear eye opening is achieved despite of an extremely large length of 300 μm of the SOA.

The SOA is divided into two or more regions and the amount of carrier consumption in each region is adjusted as illustrated in FIGS. 7 and 8 so that a clearer eye opening is obtained, deterioration of the optical signal waveform quality due to the pattern effect is curbed, and high optical output is also obtained.

As can be seen from Example 1 and Example 2, the SOA region may be divided into two regions, may be divided into three regions, or may be divided into four or more regions. When the number of divided regions is increased, an independent SOA power supply is required for each region and thus, the number of divided regions has a practical limit. Even when the region is subdivided more than necessary, the improvement of the pattern effect reaches an uppermost limit. The number of divisions of the SOA is determined in consideration of the number of power sources that can be used in the optical transmitter and effects of improving the optical waveform.

In both Examples 1 and 2 described above, when an N-th region (N is equal to or greater than 2) of the divided SOA region is focused on, a length of the N-th region in the optical waveguide direction is shorter than a length of an (N−1)-th region in the optical waveguide direction adjacent to the N-th region and proximate to the incidence end. Further, a current density of the N-th region is set to be higher than a length of the (N−1)-th region in the optical waveguide direction adjacent to the N-th region and proximate to the incidence end.

Example 3

In the optical transmitters of the two examples, the SOA is divided into two or more regions, and different SOA currents are supplied to each region so that the amount of carrier consumption in each region is adjusted, deterioration of optical signal waveform quality is curbed, and high optical output is obtained. The amount of carrier consumption inside the SOA can also be adjusted by changing a width of the SOA region. In the present example, a configuration example in which the division of the SOA region described above and change of a waveguide width of the SOA region are combined will be presented.

Figure 9:
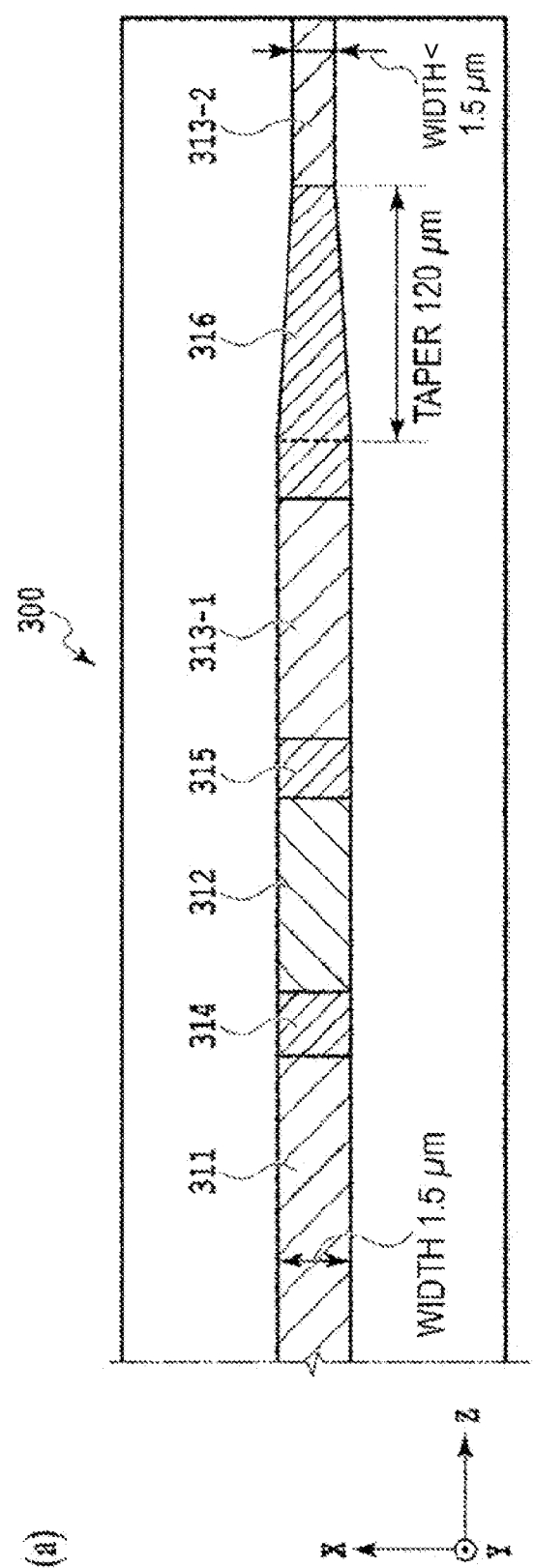
FIG. 9 is a diagram illustrating a configuration of an optical transmitter of Example 3 according to the AXEL of the present disclosure.
Figure 9:
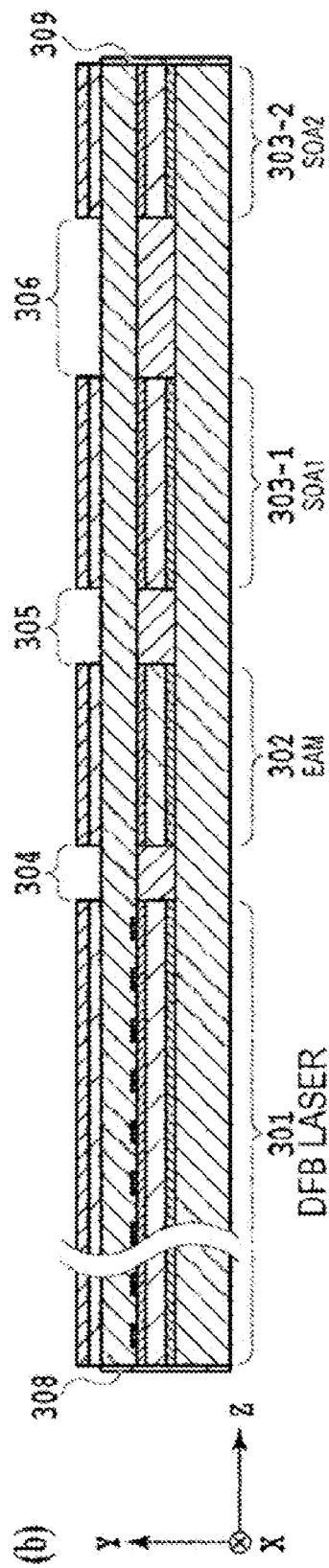

FIG. 9 is a diagram illustrating a configuration of the optical transmitter of Example 3 according to the AXEL of the present disclosure. FIG. 9(a) is a diagram illustrating a cross section (x-z plane) passing through the center of a waveguide of the optical transmitter 300 in a thickness direction and parallel to a substrate surface, and FIG. 9(b) is a diagram illustrating a cross section (y-z plane) passing through the center of the waveguide in a waveguide width direction and being perpendicular to a substrate plane. A scale in a z-axis direction does not match between FIGS. 9(a) and 9(b), and FIG. 9(a) illustrates a part in a waveguide length direction, which is slightly enlarged in a z direction as compared with FIG. 9(b). Further, in FIG. 9(a), all elements above the cross section are removed.

In the optical transmitter 300, a DFB laser 301, an EA modulator 302, and SOAs 303-1 and 303-2 are integrated in this order on the substrate. Referring to FIG. 9(b), the optical transmitter 300 includes the DFB laser 301 having a length of 300 μm, the EA modulator 302 having a length of 150 μm in front of the DFB laser 301, the first SOA region 303-1 (SOA 1) having a length of 150 μm, a tapered portion 306 composed of a passive waveguide having a length of 120 μm, and the second SOA region 303-2 (SOA 2) having a length of 100 μm. This configuration is the same as that of Example 1 in that the two SOA regions 303-1 and 303-2 are included but differs in that a waveguide width differs between the two SOA regions and a tapered waveguide is included between the two SOA regions.

As shown in a cross section (x-z plane) of the waveguide in FIG. 9(a), a waveguide 313-1 of the first SOA region is connected to a waveguide 313-2 of the second SOA region at a low loss by the tapered waveguide 316. Further, a width of the waveguide 313-1 of the first SOA region is the same (1.5 μm) as each of a width of a waveguide 311 of the DFB laser and a width of a waveguide 312 of the EA modulator, but the waveguide 313-2 of the second SOA region has a smaller width (1.0 μm). The selection of the waveguide width in the SOA will be described below.

In the two divided SOA regions (SOA 1 and SOA 2), the core layer structure formed in the initial substrate remains as it is, and is the same as that of the DFB laser, as in Examples 1 and 2. The tapered waveguide 316 between the two SOA waveguides is a passive waveguide, and it is necessary for a material having a sufficiently large band gap with respect to an oscillation wavelength of the DFB laser of 1.55 μm to be used as a core layer so that light can propagate at a low loss. In the present example, InGaAsP having a band gap wavelength of 1.3 μm is adopted as a core material. Similarly, the passive waveguide 314 is introduced between the DFB laser and the EA modulator and the passive waveguide 315 is introduced between the EA modulator and the SOA 1 such that a spacing between the regions can be sufficiently increased. Thus, separation resistance between the regions becomes large, and a leakage current generated between the regions can be curbed. As a matter of course, because separation resistance between SOA 1 and SOA 2 can be increased by the tapered waveguide 316, a leakage current in each region is reduced and the SOA can be driven with high efficiency.

The above-described passive waveguide layer is obtained by forming a core layer using selective etching and butt joint regrowth, as in a method of manufacturing the layer structure of the EA modulator described in Examples 1 and 2. Thus, in the present example, in order to form the EA modulator and each passive waveguide, a total of two butt joint regrowths are performed to manufacture a device. Other manufacture processes are the same as in Examples 1 and 2.

In the optical transmitter of the present example, among the two divided SOA regions, the width of the waveguide 313-1 of the second SOA region (SOA 2) proximate to the emission end is smaller than the width of the waveguide 313-2 of the first SOA region (SOA 1). Because this allows a current density of the SOA 2 to be made higher than that of the SOA 1 depending on the amount of carrier consumption, it is possible to further curb an influence of the pattern effect. Here, an optical output intensity when the width of the SOA is narrowed is examined.

Figure 10:
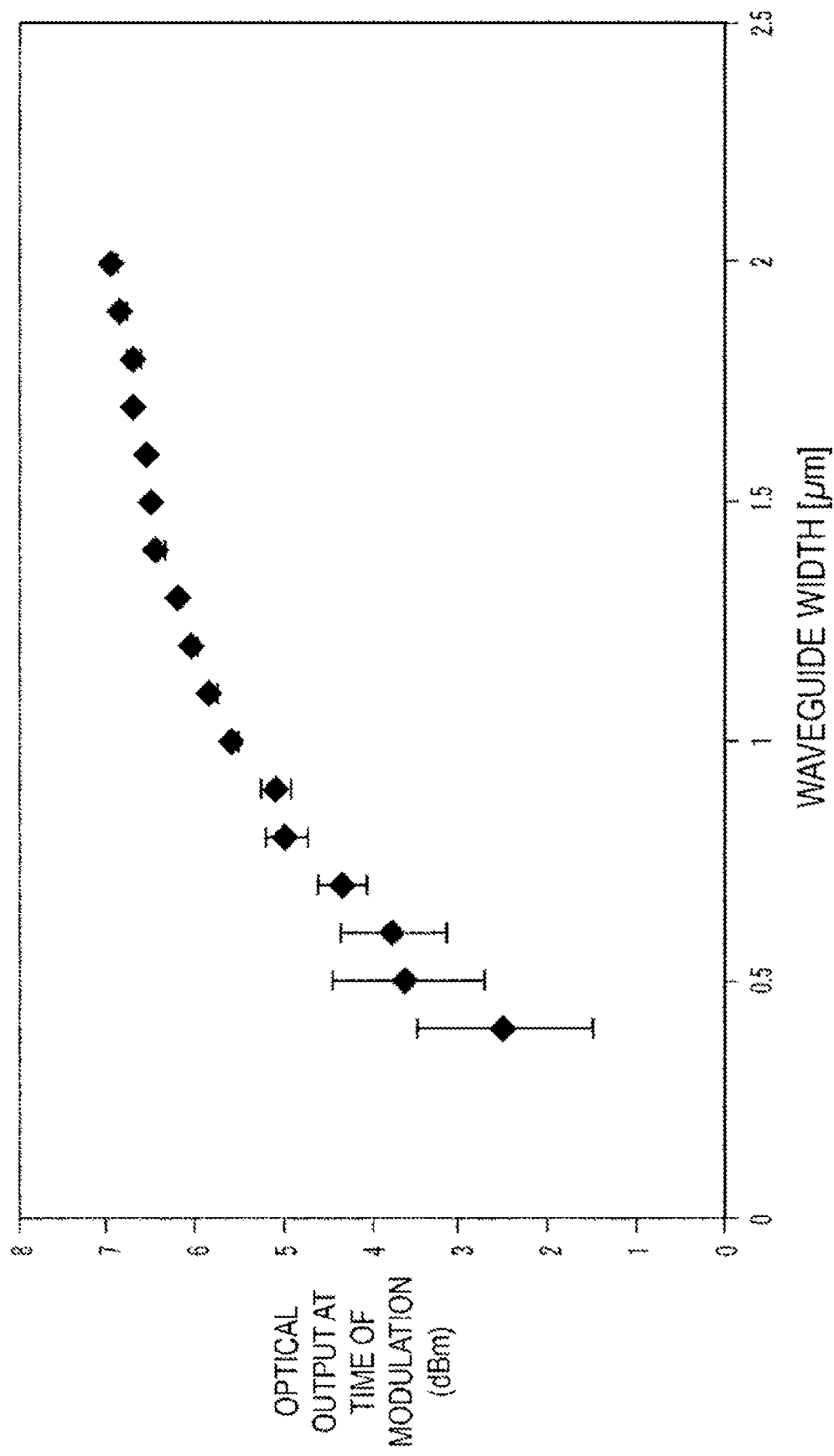
FIG. 10 is a diagram illustrating a relationship between an SOA waveguide width and an modulated light output power.

FIG. 10 is a diagram illustrating a relationship between the SOA waveguide width and the modulated light output power. For SOAs having a length of 100 μm and different waveguide widths, a width (μm) of the SOA waveguide is plotted on a horizontal axis and an optical output intensity (dBm) of the optical transmitter is plotted on a vertical axis. The light intensities incident on the SOA are all the same, and the evaluation is performed under current setting conditions in which current densities of the SOA regions are all the same. As is clear from FIG. 10, it can be seen that the optical output decreases as the waveguide width of the SOA reduces. This is because the optical confinement factor to the quantum well decreases at the same time as the waveguide width of the SOA reduces, and an effective optical gain in the waveguide decreases. What should be noted here is a variation in the optical output indicated by an error bar (error range) observed in a range in which the waveguide width is 1.0 μm or less. A variation width of the optical output also rapidly increases at the same time as the waveguide width reduces, and particularly, the variation is remarkable when the waveguide width is 0.8 μm or less. This is because a variation in the waveguide width itself that occurs when the waveguide pattern is exposed appears due to the reduction in the waveguide width, which is an unavoidable variation in a current manufacturing process.

Considering the variation in the modulated light output power due to the variation in the waveguide width itself in FIG. 10, it can be seen that there is a limit to reducing the waveguide width in the divided SOA waveguide in order to curb the pattern effect. Considering that a waveguide width of a typical DFB laser used for optical communication is 1.5 to 2.0 μm, the optical transmitter of the present example can be implemented most effectively in a range in which the waveguide width of the SOA is 0.8 μm or more and 2.0 μm or less. Based on these, in the present example, the waveguide width of the second SOA region (SOA 2) proximate to the emission end is 1.0 μm, and a waveguide width of the other regions are 1.5 μm.

Modulation characteristics of 10 Gbit/s were evaluated using a manufactured element. As the modulation signal, a pseudo-random binary sequence PRBS2$^{31}$-1 was used. Here, a current value of the DFB laser was set to 80 mA, a voltage applied to the EA modulator was set to −1.5 V, and an amplitude voltage Vpp of a signal applied to the EA modulator was 1.5 V. Current values of SOA 1 and SOA 2 were set to 60 mA and 40 mA, respectively, and a total current of 100 mA flowed in the two SOA regions 303-1 and 303-2. Current values per unit length in the optical waveguide direction in the two SOA regions were 0.4 mA/μm, but because waveguide widths (1.5 μm and 1.0 μm) of the two SOA regions differ, a current density of SOA 2 in the posterior stage was 1.5 times that of SOA 1.

When the modulated light output power of the optical transmitter of Example 3 was evaluated by fiber coupling using a single-mode fiber with a lens, 10.3 dBm was obtained. The reason why a relatively high optical output was obtained even though a waveguide width of the SOA in a final part was narrowed is considered to be improvement of fiber coupling efficiency as an additional effect of a decrease in the waveguide width. In the case of the optical transmitter of the AXEL in which a waveguide width of 1.5 μm has been adopted in the SOA, an optical field emitted from a chip has an elliptical shape. On the other hand, in an optical transmitter in which a width of the waveguide portion of SOA 2 in a latter half is reduced as in the present example, an emitted optical field approaches a circle and thus, fiber coupling efficiency in a case in which standard lens coupling has been performed is improved. In the present example, evaluation is performed using a typical fiber with a lens, and an optical fiber coupling loss is 2.0 dB in a normal AXEL chip, whereas the optical fiber coupling loss is 0.8 dB in the AXEL chip of the present example. An improvement in coupling loss of 1 dB or more has been confirmed, and it is conceivable that this improvement contributes to a relatively high optical output in the optical transmitter of the present example.

Finally, confirmation of the optical signal waveform for 10 Gbit/s modulation and the evaluation of the transmission characteristics have been performed. Although not illustrated here, an eye pattern waveform having high quality that is the same as or higher than those in Examples 1 and 2 were achieved. In addition, in the transmission characteristic evaluation using the single-mode fiber of 80 km, error-free transmission (bit error rate $10^{-12}$ or less) was achieved. From this result, a taper structure is introduced between the divided SOA regions to reduce a waveguide width of the SOA region in the posterior stage, in addition to dividing the SOA into a plurality of regions, so that a carrier density is adjusted depending on the amount of carrier consumption. It can be confirmed that a combination of the division of the SOA region with the change of the waveguide width in the SOA region as in the present example can curb the pattern effect and achieve a very high optical output and a high quality optical waveform.

As described in detail above, with the optical transmitter of the present disclosure, in the AXEL in which the SOA has monolithically integrated, it is possible to curb the deterioration of the optical waveform quality while using the same manufacturing process as that of the EADFB laser, resulting in high optical output and a high-quality optical waveform. An effect of dividing the SOA into a plurality of regions and making the carrier density uniform is not limited to only the wavelength band shown in each example, but can also be applied to an optical communication band such as 1.26 to 1.60 μm.

INDUSTRIAL APPLICABILITY

The present invention can be used for optical communication. For example, the present invention can be used for optical transmitters.

The invention claimed is:

1. An optical transmitter comprising, on a substrate:
   a distributed feedback (DFB) laser including an active region with a multi quantum well;
   an electro-absorption (EA) modulator configured to modulate light emitted from the DFB laser; and
   a semiconductor optical amplifier (SOA) having an active region with an identical composition as the active region of the DFB laser and configured to amplify signal light from the EA modulator,
   wherein the SOA includes two or more electrically separated regions defined by contact layers disposed on the SOA along an optical waveguide direction, and a length in the optical waveguide direction of an N-th region (N is equal to or greater than 2) counting from an incidence end of the SOA is shorter than a length of the region located closer to the incidence end than the N-th region.

2. The optical transmitter according to claim 1, wherein the DFB laser, the EA modulator, and the SOA are monolithically integrated on the substrate, and optical waveguide structures of the DFB laser and the SOA are an identical layer structure.

3. The optical transmitter according to claim 1, wherein a current density of the N-th region of the SOA is set to be higher than a current density of the region located closer to the incidence end than the N-th region.

4. The optical transmitter according to claim 1, wherein a passive waveguide is included between two adjacent regions among the two or more electrically separated regions of the SOA.

5. The optical transmitter according to claim 4, wherein a waveguide width of the region located closer to the incidence end than the N-th region is larger than a waveguide width of the N-th region, the waveguide width is a width of the waveguide perpendicular to the optical waveguide direction in a plane of the waveguide.

6. The optical transmitter according to claim 4, wherein a waveguide width of a second region of the SOA is 0.8 μm or more and 2.0 μm or less.

7. The optical transmitter according to claim 1, wherein a length of a first region of the SOA in an optical waveguide direction is 150 μm or less.

* * * * *